(12) United States Patent
Dirahoui et al.

(10) Patent No.: US 7,105,398 B2
(45) Date of Patent: Sep. 12, 2006

(54) METHOD FOR MONITORING LATERAL ENCROACHMENT OF SPACER PROCESS ON A CD SEM

(75) Inventors: Bachir Dirahoui, Bedford Hills, NY (US); Renee T. Mo, White Plains, NY (US); Ravikumar Ramachandran, Pleasantville, NY (US); Eric P. Solecky, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/942,303

(22) Filed: Sep. 16, 2004

(65) Prior Publication Data

US 2006/0055393 A1    Mar. 16, 2006

(51) Int. Cl.
*H01L 21/8238* (2006.01)
(52) U.S. Cl. .................... 438/221; 438/265; 438/287
(58) Field of Classification Search ............... 438/221, 438/263, 264, 265, 283, 287, 303

See application file for complete search history.

(56) References Cited

U.S. PATENT DOCUMENTS 5,851,864 A * 12/1998 Ito et al. .................... 438/203
2004/0075151 A1    4/2004 Fung et al.

* cited by examiner

*Primary Examiner*—Phuc T. Dang
(74) *Attorney, Agent, or Firm*—Scully, Scott, Murphy & Presser, P.C.; Todd M. C. Li, Esq.

(57) ABSTRACT

A process implementing steps for determining encroachment of a spacer structure in a semiconductor device having thick and thin spacer regions, including a transition region formed therebetween. The method steps comprise: obtaining a line width roughness (LWR) measurement at at least one location along each thick, thin and transition spacer regions; determining a threshold LWR measurement value based on the LWR measurements; defining a region of interest (ROI) and obtaining a further LWR measurement in the ROI; comparing the LWR measurement in the ROI against the threshold LWR measurement value; and, notifying a user that either encroachment of the spacer structure is present when the LWR measurement in the ROI is below the threshold LWR measurement value, or that no encroachment of the spacer structure is present when the LWR measurement in the ROI is above the threshold LWR measurement value.

11 Claims, 5 Drawing Sheets

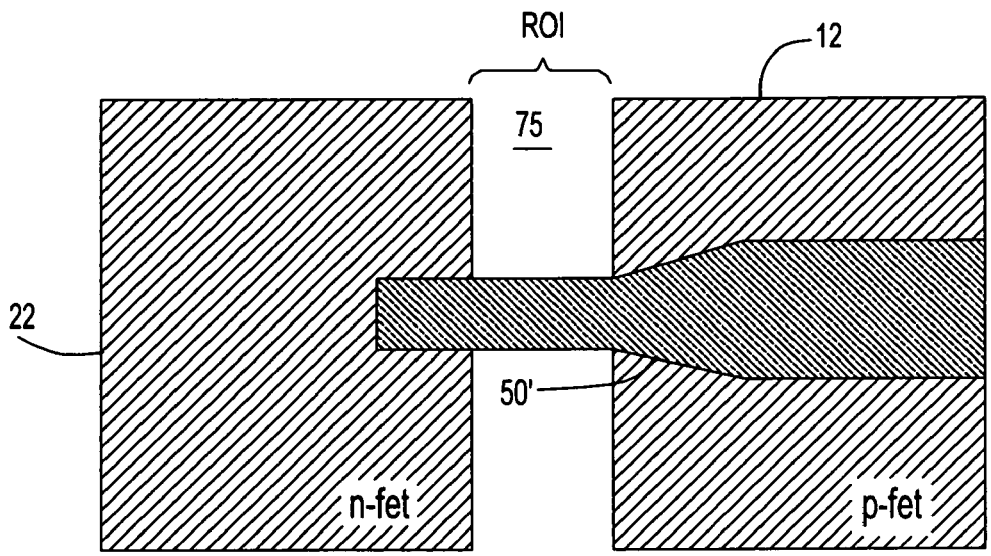
FIG. 2(a)
(PRIOR ART)
ENCROACHMENT INTO p-fet
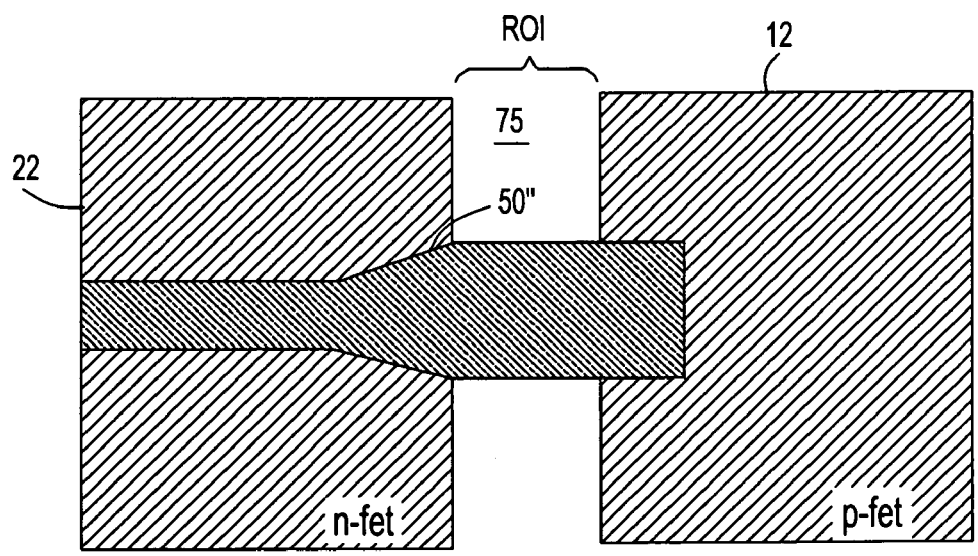
FIG. 2(b) ENCROACHMENT INTO n-fet
(PRIOR ART)

METHOD FOR MONITORING LATERAL ENCROACHMENT OF SPACER PROCESS ON A CD SEM

BACKGROUND OF THE INVENTION

1. Field of the Invention

This invention presents a novel technique for the in-situ monitoring of lateral encroachment during etch processes, and particularly to a method and system implementing an in-line CD SEM or any other metrology tool capable of making line roughness measurement to measure and control the etch process by making a line width roughness measurement (LWR) in a lateral implant/dual spacer encroachment region of interest. The magnitude of the line width roughness enables early detection of a process excursion.

2. Description of the Prior Art

In semiconductor manufacturing, lateral implant/dual spacer encroachment in a dual spacer process is severely detrimental to device functionality, specifically device threshold voltage (Vth). Currently, there is no way of monitoring this in an automated and reliable fashion other than at the time of electrical test which may take months later to perform. Detecting encroachment much sooner than at electrical test is very desirable. An in-line measurement after the structure of interest is created with fast feedback and turnaround time is needed in order to determine device functionality.

FIG. 1 illustrates cross-section view of both a pFET device 10 and an nFET device 20 formed in respective pFET device and NFET device regions 12, 22 on a semiconductor substrate. As shown in FIG. 1, a dual spacer structure 50, formed according to known techniques such as described in detail in commonly-owned, co-pending U.S. patent application Ser. No. 10/277,907 (U.S. Patent Application Publication No. U.S. 2004/0075151 A1), the whole contents and disclosure of which is incorporated by reference as if fully set forth herein, extends from the pFET device 10 in the pFET region 12 through a transition region 75 to the nFET device 20 in the nFET region 22. As described in co-pending U.S. patent application Ser. No. 10/277,907, the dual spacer comprises two different spacer thicknesses for nFET and pFET devices and FIG. 1 depicts the desirable condition of a structure exhibiting no encroachment in either NFET and pFET devices. In the transition region 75, the thickness of the dual spacer 50 gradually thins as the spacer transitions from the pFET to the NFET device. A particular series of processing steps involved in the fabrication of the dual spacer is now described: In these series of steps, after deposition of a spacer nitride, for example, by PECVD, and deposition of a further dual spacer ozone TEOS and TEOS spacer etch, a Dual Spacer (DS) mask is patterned and developed over the pFET device and an etch process is performed, e.g., implementing a wet etch, however, as would be known to skilled artisans, other types of etch processes (e.g., dry-etch) are contemplated. The etch is performed to remove the TEOS spacer (e.g., oxide) from the NFET. During the wet etch, liquid encroaches under a resist layer that etches the TEOS spacer oxide towards the pFET thus, resulting in spacer thinning in a transition region. If the transition region encroaches onto the pFET device region, the variation in spacer thickness causes pFET (threshold voltage) Vt spreading. For example, spacer thickness variation through oxide spacer RIE—introduced center/edge variation resulting in pFET Vt variation from about 80 mV from an even spacer to 200 mV for thickness variation in spacer. An encroachment causing spacer thinning would also translate to pFET Vt variations. Additionally, the performance of the device may be degraded.

To illustrate the problem, FIG. 2(a) depicts an example dual spacer structure exhibiting encroachment into the pFET device region 12, and FIG. 2(b) depicts an example dual spacer structure exhibiting encroachment into the NFET device region 22. As shown in FIGS. 2(a) and 2(b), encroachment into the pFET region shows the transition region of the dual spacer shifted 50' while encroachment into the NFET region shows the transition region of the dual spacer shifted 50". Both of these encroachments result in reduced device performance, however, typically it is never known until electrical device testing is performed, some one hundred or more processing steps later.

It would be highly desirable to provide a process that employs an in-line CD SEM to measure and control the dual spacer process by making a line width roughness measurement (LWR) in the region of interest, i.e., transition region. This measurement is made after the dual spacer is created, well before electrical test, thus enabling detection of an early process excursion.

SUMMARY OF THE INVENTION

The present invention is directed to a process and computer program storage device that employs an in-line CD SEM to measure and control the process by making a line width roughness measurement (LWR) in the region of interest. The magnitude of the line width roughness indicates whether significant implant encroachment will be present, thus allowing control of subsequent processing lots.

According to the invention, there is provided a methodology that uses an in-line CD SEM to measure and flag issues in the dual spacer process by making a line width roughness measurement (LWR) in the region of interest (ROI). This measurement is made after the dual spacer is created, well before electrical test. The magnitude and location of the line width roughness indicates whether significant implant encroachment will be present and thus enables detection of an early process excursion. The CD SEM obtained LWR measurement post dual spacer correlates with Vth spread, thereby providing early detection of potential device issues.

According to a first embodiment of the invention, there is provided a method and program storage device implementing steps for determining encroachment of a spacer structure in a semiconductor device having thick and thin spacer regions, including a transition region formed therebetween, the method steps comprising:

a) obtaining a line width roughness (LWR) measurement at at least one location along each thick, thin and transition spacer regions;

b) determining a threshold LWR measurement value based on said line width roughness (LWR) measurements;

c) defining a region of interest (ROI) and obtaining a further LWR measurement in said ROI;

d) comparing said LWR measurement in said ROI against said threshold LWR measurement value; and, e) notifying a user that either encroachment of said spacer structure is present when said LWR measurement in said ROI is below said threshold LWR measurement value, or that no encroachment of said spacer structure is present when said LWR measurement in said ROI is above said threshold LWR measurement value.

According to a second embodiment of the invention, there is provided a method and program storage device implementing steps for enabling early detection of future voltage threshold errors in transistor device structures formed in a semiconductor wafer, said method comprising steps of:

a. utilizing a critical dimension feature measurement tool to determine a Line Width Roughness (LWR) metric of said structure in a Region of Interest (ROI);
b. obtaining a LWR measurement of a feature of said device structure in said ROI; and
c. comparing said LWR measurement in said ROI against said LWR metric; and,
d. controlling parameters associated with manufacturing process of said structure as a result of said comparing.

Advantageously, by measuring on a CD SEM after the dual spacer process is complete, over one hundred process steps may be saved in comparison to a prior detection point of first metal test (e.g., 21–28 days later in typical processing embodiments). In some cases, wafer final test may be the first detection point. In this case, even more process steps are saved.

BRIEF DESCRIPTION OF THE DRAWINGS

Further features, aspects and advantages of the structures and methods of the present invention will become better understood with regard to the following description, appended claims, and accompanying drawings where:

FIG. 2(a) depicts an example dual spacer structure exhibiting encroachment into an pFET device region 12, and FIG. 2(b) depicts an example dual spacer structure exhibiting encroachment into an nFET device region;

DETAILED DESCRIPTION OF THE PREFERRED EMBODIMENTS

According to the system and methodology of the invention, there is implemented an in-line critical dimension scanning electron microscope (CD SEM) to measure and flag issues in the dual spacer process by making a line width roughness (LWR) measurement in a region of interest (ROI). This LWR measurement is made after the dual spacer is created during the manufacturing process, well before electrical test. The magnitude and location of the line width roughness indicates whether significant implant (e.g., source/drain) encroachment will be present and thus enables detection of an early process excursion. The CD SEM obtained LWR measurement post dual spacer correlates with Vth spread, thereby providing early detection of device issues.

Figure 1:
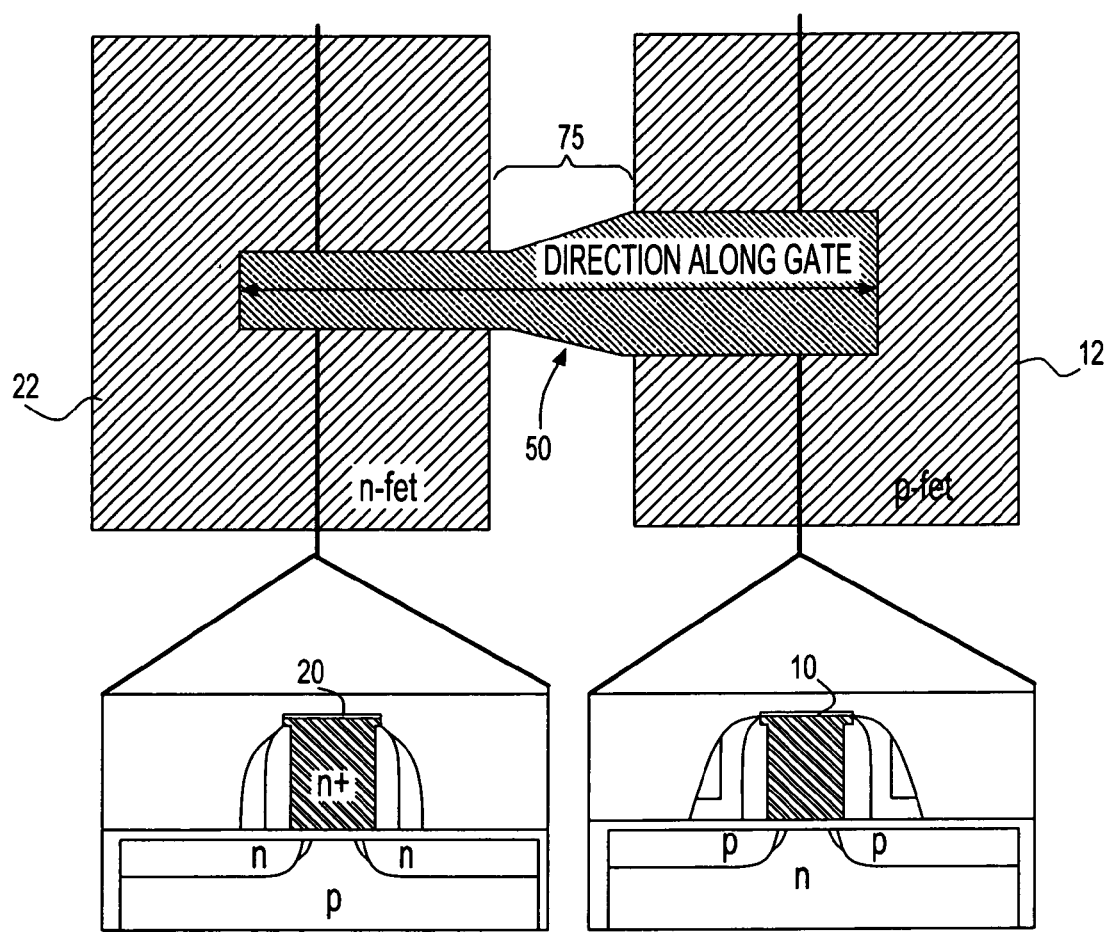
FIG. 1 illustrates two cross-sectional views of a dual spacer over two transistor devices separated by shallow trench isolation (STI)
Figure 3:
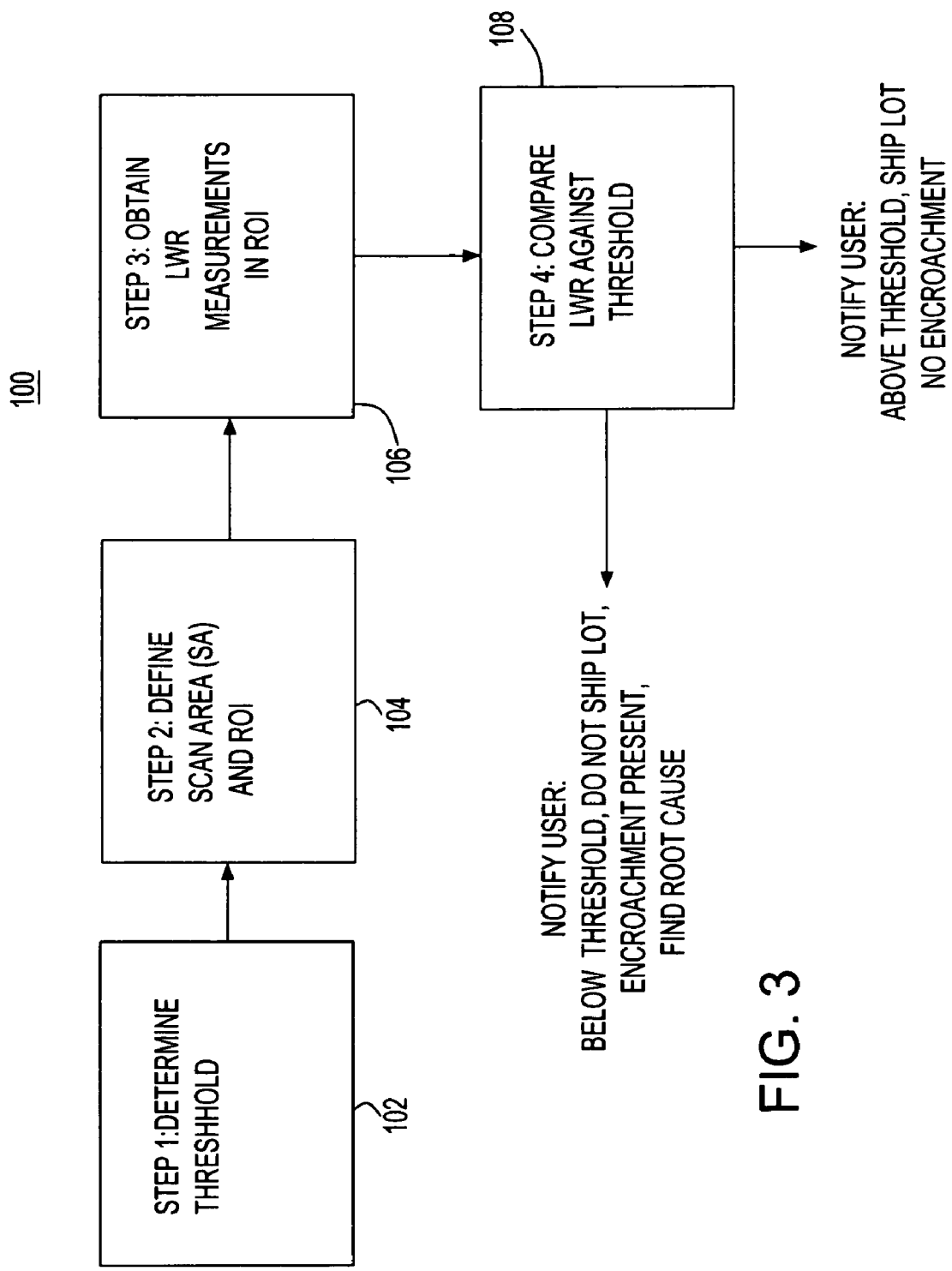
FIG. 3 illustrates the methodology for detecting encroachment of a dual spacer structure in device regions using LWR measurements according to the invention.
Figure 4:
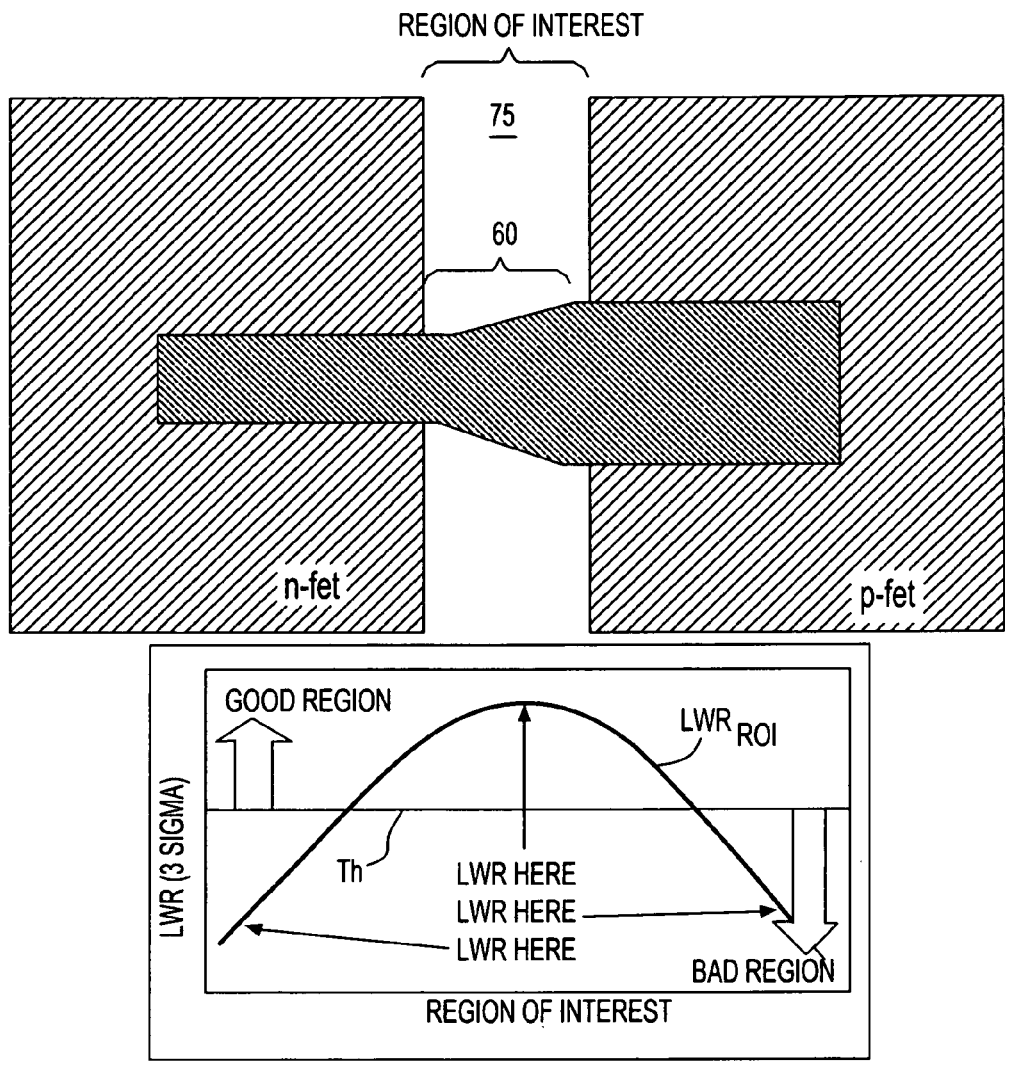
FIG. 4 depicts how the threshold for encroachment is determined using measured LWR values.

FIG. 3 is a block diagram depicting the methodology 100 of the invention. As shown in FIG. 3, a first step 102 is the determination of a threshold line width roughness value which utilizes the measured LWR values taken by the CD SEM. FIG. 4 depicts how the threshold for encroachment is determined using the measured LWR values. As shown in FIG. 4, there is first defined a region of interest 75 (ROI) where minimum spacing exists between pFET and NFET regions 12, 22 along a gate. This is depicted as an area 75 shown in FIG. 4. Then, three line width measurements, LWR1, LWR2, LWR3 are determined where LWR1 represents the measured critical dimension LWR 60 in the transition region 75 along a gate; LWR2 represents the measured critical dimension LWR 42 in thin spacer region along a gate; and LWR3 represents the measured critical dimension LWR 32 in thick spacer region along a gate. Preferably, the LWR1 measurement is performed at a location where isolation distance between pFET and nFET region is minimum. It should be understood that LWR1, LWR2 and LWR3 specify the regions along the gate to measure, these measurements being made independent of how gate aligns with respect to nFET and pFET regions. Calculation of these LWR1, LWR2, LWR3 values are determined according, but not limited to, equation 1) as follows:

$$LWR = \sqrt{\frac{\sum_{i=1}^{n}(x_i - \hat{x}_i)^2}{n-1}} \qquad 1)$$

where: n=the number of line scans and may range between 1<n<1000, for example; $x_i$=the measured CD at each line scan n; and $\hat{x}_i$=the average measured CD for all of the n line scans. As would be known to skilled artisans, the LWR value calculated in accordance with equation 1) may be multiplied by a sigma (σ) comprising an integer value 1, 2, 3, . . . , etc. Thereafter, three line width measurements, LWR1, LWR2, LWR3 are used to determine the threshold, Th, according, but not limited to, equation 2) as follows:

$$Th = LWR1 - LWR2 - LWR3. \qquad 2)$$

Figure 5:
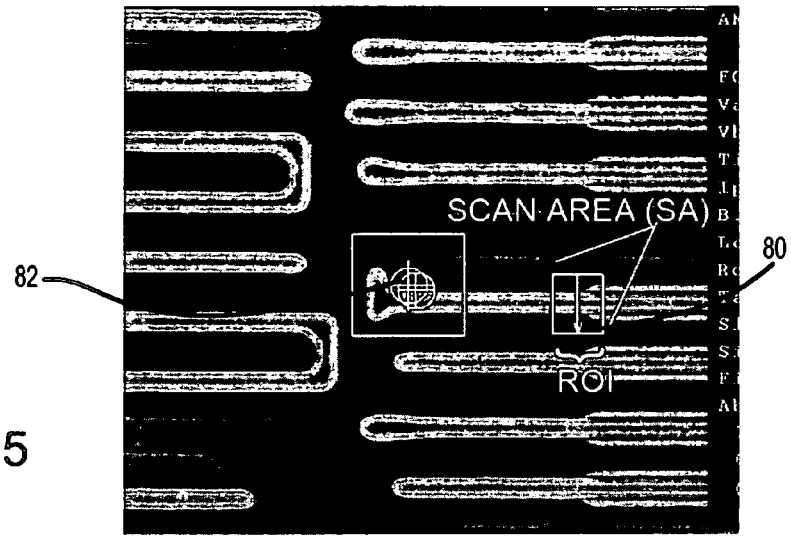
FIG. 5 is a photomicrograph depicting an example of a fabricated dual spacer region indicating a CD SEM scan tool measurement box 80; and, FIG. 6(a) depicts a photomicrograph of a LWR$_{ROI}$ measurement at a defined dual spacer ROI showing a resulting structure corresponding to good processing whereby encroachment does not occur in nFET and pFET regions.

Returning to FIG. 3, a next step 104 is the determination of a scan area (SA) that corresponds to how large the measurement box on the CD SEM tool needs to be in the ROI 75 along a gate. That is, the SA is governed according to the following equation 3):

$$SA = ROI - \delta \qquad 3)$$

where δ represents a correction factor for correcting any potential CD SEM gate placement error where placement of middle of SA is at the center of the ROI such as shown in FIG. 5. FIG. 5 is a photomicrograph depicting an example of a fabricated dual spacer region indicating a CD SEM scan tool measurement box 80. The δ factor is generated according to a known uncertainty in gate placement for a given CD SEM tool. It is imperative that the ROI always scans over only STI knowing the tool's uncertainty in placing the gate at this exact location each time. The ROI, in the direction along the gate, is made smaller to accommodate this known δ. This value is dependent upon the CD SEM and other measurement conditions.

Returning to FIG. 3, a next step 106 is the step for performing the actual LWR measurement in the ROI by the CD SEM tool. Determination of the LWR in the previously determined scan area (SA) is governed according, but not limited to, equation 4) as follows:

$$LWR_{ROI} = \sqrt{\frac{\sum_{i=1}^{n}(x_i - \hat{x}_i)^2}{n-1}} \quad 4)$$

where: n=the number of line scans taken in the ROI, e.g., may range between 1<n<1000; $x_i$=the measured CD at each line scan n; and $\hat{x}_i$=the average measured CD for all of the n line scans. As would be known to skilled artisans, the $LWR_{ROI}$ value calculated in accordance with equation 1) may be multiplied by a sigma ($\sigma$) comprising an integer value 1, 2, 3, . . . , etc.

Returning to FIG. 3, at a final step 108, the actual measured LWR in the ROI is compared against the threshold determined at step 102. This step is depicted in FIG. 4 where the $LWR_{ROI}$ measurement is compared to the threshold Th. If the $LWR_{ROI}$ measurement is greater than the determined Th, then this indicates that there is no encroachment and that the lot including the semiconductor structure having a dual spacer connecting NFET and pFET devices may be shipped. Otherwise, if the $LWR_{ROI}$ measurement is less than the determined Th, then this indicates that there is encroachment into either the pFET or nFET region and, that the lot including the semiconductor structure having a dual spacer connecting NFET and pFET devices should not be shipped. An engineer may then be flagged to find the root cause of the encroachment.

Thus, the detection of an encroachment utilizing the LWR measurement enables the stoppage of processing lots that will have degraded performance. In response to the detection, the etch rate of a potentially problematic TEOS etch tool may be examined and adjusted to avoid misprocessing subsequent lots.

Figure 6A:
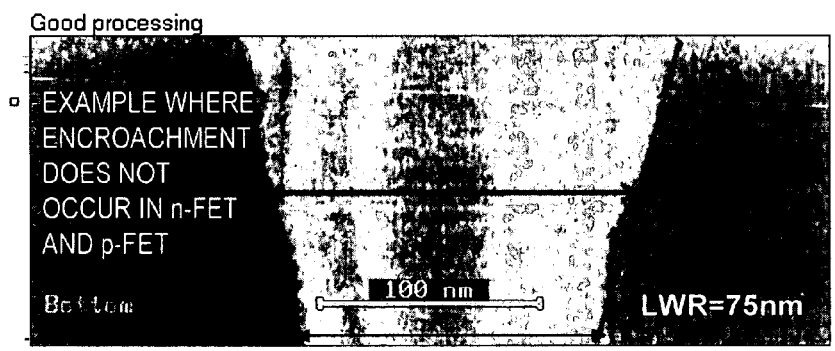
FIG. 6(b) depicts a photomicrograph of a LWR$_{ROI}$ measurement at a defined dual spacer ROI showing a resulting structure corresponding to bad processing whereby encroachment does occur in either the nFET or pFET regions.
Figure 6B:
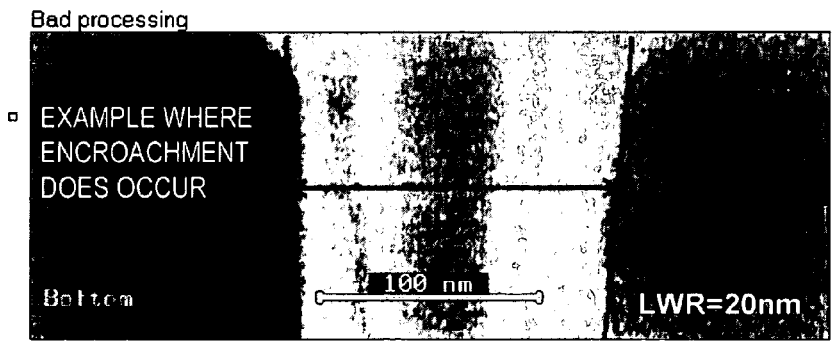

FIG. 6(a) depicts a photomicrograph of a $LWR_{ROI}$ measurement at a defined dual spacer ROI (scan area 80 of FIG. 5) showing a resulting structure corresponding to good processing whereby encroachment does not occur in nFET and pFET regions, and FIG. 6(b) depicts a photomicrograph of a $LWR_{ROI}$ measurement at a defined dual spacer ROI (scan area 80 of FIG. 5) showing a resulting structure corresponding to bad processing whereby encroachment does occur in either the nFET or pFET regions. The magnitude of the linewidth indicates whether encroachment occurred in nFET or pFET region, the pFET linewidth will be wider than the nFET linewidth.

Advantageously, by measuring on CD SEM at dual spacer, about 150 process steps may be saved before prior to a detection point that may be a first metal test (e.g., 21–28 days later). If it cannot be detected, at first metal test it will take more than 500 (120 days) steps later at wafer final test to detect Vth issue.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for determining encroachment of an insulator structure in a semiconductor device, the structure having thick and thin regions, including a transition region formed therebetween, said method comprising:
   a) obtaining a line width roughness (LWR) measurement at at least one location along each thick, thin and transition regions;
   b) determining a threshold LWR measurement value based on said LWR measurements;
   c) defining a region of interest (ROI) and obtaining a further LWR measurement in said ROI;
   d) comparing said LWR measurement in said ROI against said threshold LWR measurement value; and,
   e) providing a notification that either encroachment of said structure is present when said LWR measurement in said ROI is below said threshold LWR measurement value, or that no encroachment of said structure is present when said LWR measurement in said ROI is above said threshold LWR measurement value.

2. The method as claimed in claim 1, wherein said step a) of obtaining a LWR measurement at at least one location along each thick, thin and transition regions includes the steps of: implementing a critical dimension (CD) scan tool for linear scanning across a feature of said structure to obtain a CD scan measurement, a CD scan measurement at a transition region is defined as LWR1, a CD scan measurement at a thin region is defined as LWR2, and a CD scan measurement at a thick region is defined as LWR3.

3. The method as claimed in claim 2, wherein said step a) of obtaining a line LWR1 measurement is performed at a location where isolation distance between pFET and nFET region is minimum.

4. The method as claimed in claim 2, wherein said step a) of obtaining a line width roughness (LWR) measurement at each said thick, thin and transition regions includes the step of determining a LWR according to:

$$LWR = \sqrt{\frac{\sum_{i=1}^{n}(x_i - \hat{x}_i)^2}{n-1}}$$

where: n=the number of line scans in the region; $x_i$=the measured CD at each line scan n; and $\hat{x}_i$=the average measured CD for all of the n line scans.

5. The method as claimed in claim 2, wherein a threshold, Th, is determined according to:

Th=LWR1−LWR2−LWR3.

6. The method as claimed in claim 1, wherein said step c) of defining a ROI further includes the step of determining a scan area corresponding to how large a measurement box defined by the CD SEM tool needs to be in the ROI.

7. The method as claimed in claim 6, wherein said step c) of defining a ROI further includes the step of determining a correction factor for correcting any potential CD SEM gate placement error and modifying a scan area in said ROI according to said correction factor.

8. The method as claimed in claim 6, wherein said step c) of obtaining a line width roughness (LWR) measurement in said ROI includes the step of determining a $LWR_{ROI}$ according to:

$$LWR_{ROI} = \sqrt{\frac{\sum_{i=1}^{n}(x_i - \hat{x}_i)^2}{n-1}}$$

where: n=the number of line scans taken in the ROI; $x_i$=the measured CD at each line scan n; and $\hat{x}_i$=the average measured CD for all of the n line scans.

9. A method for enabling early detection of voltage threshold errors in transistor devices including insulator structures formed in a semiconductor wafer, said method comprising:

a. implementing a critical dimension feature measurement tool to determine a Line Width Roughness (LWR) metric of said insulator structure in a Region of Interest (ROI);

b. obtaining a LWR measurement of a feature of said insulator structure in said ROI; and c. comparing said LWR measurement in said ROI against said LWR metric; and, d. controlling parameters associated with a future manufacturing process of said insulator structure as a result of said comparing.

10. The method as claimed in claim 9, wherein said critical dimension feature measurement tool comprises a CD Scanning Electron Microscope.

11. The method as claimed in claim 9, wherein said controlling parameters step d) includes controlling parameters associated with etch technique for etching an dielectric material in said insulator structure.

* * * * *